(12) United States Patent
Lee et al.

(10) Patent No.: US 9,105,655 B2
(45) Date of Patent: Aug. 11, 2015

(54) SEMICONDUCTOR DEVICE AND METHOD FOR MANUFACTURING THE SAME

(71) Applicant: SK hynix Inc., Icheon-si (KR)

(72) Inventors: Byoung Hoon Lee, Seoul (KR); Chang Moon Lim, Seoul (KR)

(73) Assignee: SK HYNIX INC., Icheon (KR)

( * ) Notice: Subject to any disclaimer, the term of this patent is extended or adjusted under 35 U.S.C. 154(b) by 39 days.

(21) Appl. No.: 13/710,415

(22) Filed: Dec. 10, 2012

(65) Prior Publication Data

US 2013/0153990 A1    Jun. 20, 2013

(30) Foreign Application Priority Data

Dec. 16, 2011   (KR) .................. 10-2011-0136022

(51) Int. Cl.
```
H01L 21/70      (2006.01)
H01L 29/66      (2006.01)
H01L 29/78      (2006.01)
H01L 27/108     (2006.01)
H01L 27/02      (2006.01)
```
(52) U.S. Cl.
CPC .... *H01L 29/66666* (2013.01); *H01L 27/10876* (2013.01); *H01L 27/10888* (2013.01); *H01L 29/7827* (2013.01); *H01L 27/0207* (2013.01); *H01L 27/10885* (2013.01)

(58) Field of Classification Search
None
See application file for complete search history.

(56) References Cited

U.S. PATENT DOCUMENTS

| | | | |
|---|---|---|---|
| 2010/0090263 A1* | 4/2010 | Kunkel et al. ................ 257/296 |
| 2010/0105210 A1* | 4/2010 | Chen et al. .................... 438/702 |
| 2011/0129975 A1* | 6/2011 | Lee ................................ 438/270 |
| 2011/0180910 A1* | 7/2011 | Kim .............................. 257/623 |
| 2011/0186970 A1 | 8/2011 | Sung |
| 2011/0189843 A1 | 8/2011 | Lee et al. |
| 2011/0291182 A1 | 12/2011 | Lee |

FOREIGN PATENT DOCUMENTS

| | | |
|---|---|---|
| KR | 10-2011-0089033 A | 8/2011 |
| KR | 10-2011-0089760 A | 8/2011 |
| KR | 10-2011-0130152 A | 12/2011 |

* cited by examiner

*Primary Examiner* — David Vu
*Assistant Examiner* — Cuong Nguyen (57) ABSTRACT

In a semiconductor device and a method for manufacturing the same, a pillar pattern is formed in an alternating pattern and a one side contact (OSC) is formed without using a tilted ion implantation process or a mask, resulting in formation of a vertical gate. The semiconductor device includes an alternating or zigzag-type pillar pattern formed over a semiconductor substrate, a first hole formed between pillars of the pillar pattern, a passivation layer formed over a sidewall of the first hole, a second hole formed by partially etching a lower part of the first hole, a bit line formed in the second hole, and a contact formed at a lower part of the pillar pattern.

10 Claims, 14 Drawing Sheets

SEMICONDUCTOR DEVICE AND METHOD FOR MANUFACTURING THE SAME

CROSS-REFERENCE TO RELATED APPLICATION

The priority of Korean patent application No. 10-2011-0136022 filed on 16 Dec. 2011, the disclosure of which is hereby incorporated in its entirety by reference, is claimed.

BACKGROUND OF THE INVENTION

In recent times, Dynamic Random Access Memory (DRAM) has been widely used throughout the world, because information can be freely input to or output from DRAM, and it is capable of being implemented as a high-capacity memory.

Generally, the DRAM is comprised of a metal oxide semiconductor (MOS) transistor and a storage capacitor. The MOS transistor enables charges carrying data to move in the storage capacitor during write and read operations. In addition, DRAM performs a refresh operation that periodically provides charges to the storage capacitor so as to prevent the occurrence of lost or damaged data caused by a leakage current or the like.

In order to produce a highly integrated DRAM, a capacitor is needed that can provide sufficient storage capacity in a smaller area. In order to increase price competitiveness of DRAM, increasing the integration degree is a matter of the highest priority. For this purpose, each DRAM cell may be formed to have a small-sized cell. However, as the semiconductor device is reduced in size, characteristics of the semiconductor device deteriorate because of a short channel effect.

Typically, DRAM fabrication is restricted by a minimum lithography feature size (F) caused by a photolithography process, and the conventional technology requires an area of 8F2 per memory cell. In addition, a conventional transistor has a planar channel region, which limits integration and current aspects.

In order to overcome the above-mentioned limitations, the conventional transistor with a planar channel region has been improved to include three-dimensional (3D) channel regions such as a recessed gate, a fin gate, a buried gate, etc. However, an improved transistor including 3D channel regions also encounters problems when the semiconductor device is scaled down.

In order to resolve these problems, a vertical transistor has been proposed. In the case of a general transistor, high-density source/drain regions are formed at right and left sides of a semiconductor substrate, such that a channel region of the general transistor is formed in a horizontal direction. In contrast, the vertical transistor includes a high-density source/drain region formed in a vertical direction, such that a channel region thereof is formed at upper and lower parts of the semiconductor substrate.

However, in a conventional vertical transistor, which includes a channel region formed of undoped silicon, it is difficult to control voltage in a structures in the semiconductor. Therefore, in a conventional vertical transistor, it is difficult to effectively control various phenomena, such as a punch-through or floating body effect. That is, when the vertical transistor is not operated, gate induced drain leakage (GIDL) occurs or holes are collected in a structure, such that a threshold voltage of the transistor can be reduced, resulting in an increase in a lost current of the transistor. As a result, charges stored in a capacitor are leaked so that data is lost. In addition, in a conventional vertical transistor, it is difficult to form a One Side Contact (OSC) at a sidewall. For example, in order to form a contact at a sidewall, a mask may be used, or tilted ion implantation may be performed. In the case of forming the contact using a mask, difficulties arise not only in overlay adjustment, but also in pattern implementation. In the case of forming the contact by performing tilted ion implantation, a margin of the tilt angle is reduced because the pattern size of the memory cell is greatly reduced, and adjusting energy is difficult because the energy used in such an ion implantation process is already low.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device in which an alternating pillar pattern is formed and a one side contact (OSC) is formed without using either a tilted ion implantation process or a mask, resulting in formation of a vertical gate, and a method for manufacturing the same.

In accordance with an aspect of the present invention, a semiconductor device includes a zigzag-type pillar pattern formed over a semiconductor substrate; a first hole formed between the pillar patterns; a passivation layer formed at a sidewall of the first hole; a second hole formed by partially etching a lower part of the first hole; a bit line formed in the second hole; and a contact formed at a lower part of the pillar pattern.

The pillar pattern may include silicon (Si), and a channel region is formed at a lower part of the pillar pattern.

The passivation layer may include an oxide film or a nitride film.

The bit line may be formed in a line type.

The semiconductor device may further include a hard mask layer formed over the semiconductor substrate.

In accordance with another aspect of the present invention, a method for manufacturing a semiconductor device includes forming an insulation film over a semiconductor substrate; forming a contact hole by etching the insulation film until the semiconductor substrate is exposed; forming a pillar pattern by growing silicon of the semiconductor substrate in the contact hole; forming a first hole by etching the insulation film using a bit line mask; forming a passivation layer at a sidewall of the first hole; forming a second hole by etching the insulation film; burying a conductive material in each of the first hole and the second hole, and forming a buried bit line through etch-back processing; and forming a contact by implanting ions in the pillar pattern.

The method may further comprise forming a first hard mask layer between the semiconductor substrate and the insulation film.

The method may further include, after forming the pillar pattern, planarizing the silicon.

The method may further include, after planarizing the silicon, forming a second hard mask layer not only over the pillar pattern but also over the insulation film.

The forming the second hole may apply a wet etching process to the insulation film.

The conductive material may include metal or doped polysilicon.

The forming the contact hole may include etching the insulation film in such a manner that the contact hole is arranged in a zigzag pattern.

It is to be understood that both the foregoing general description and the following detailed description of the present invention are exemplary and explanatory and are intended to provide further explanation of the invention as claimed.

BRIEF DESCRIPTION OF THE DRAWINGS

In FIGS. 1A to 1I, (ii) shows a plan view of a semiconductor device according to an embodiment of the present invention, and (i) shows a cross-sectional view of the semiconductor device shown in (ii) taken along the line X-X'.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the appended drawings.

FIGS. 1A to 1I show a semiconductor device and a method for manufacturing the same according to an embodiment of the present invention. In FIGS. 1A to 1I, (ii) shows a plan view of a semiconductor device according to an embodiment of the present invention, and (i) shows a cross-sectional view of the semiconductor device shown in (ii) taken along the line X-X'.

Figure 1A:
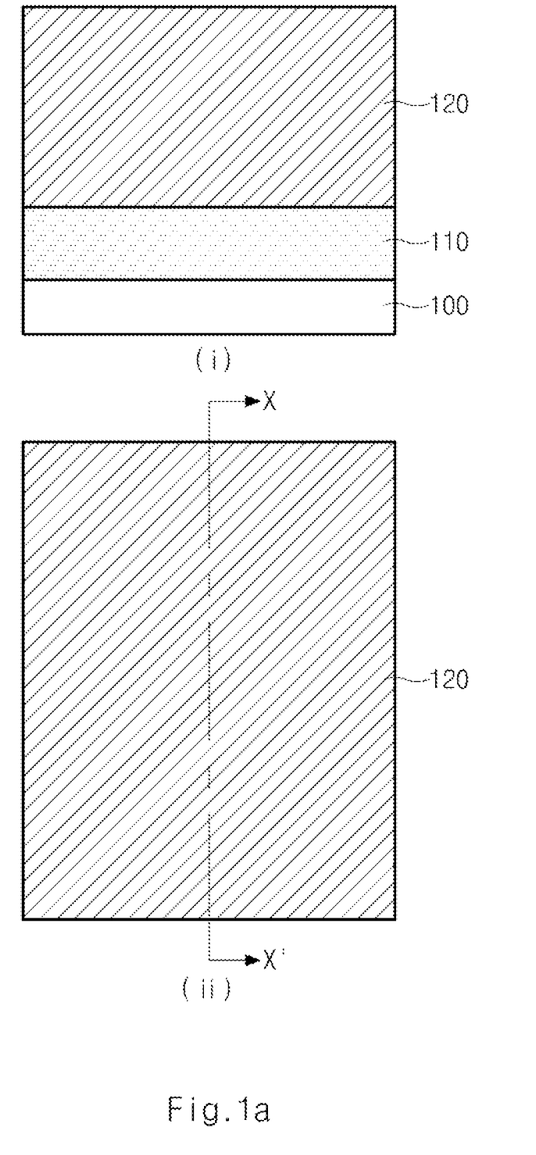
FIGS. 1A to 1I show a semiconductor device and a method for manufacturing the same according to an embodiment of the present invention.

Referring to FIG. 1A, a first hard mask layer 110 is formed over a semiconductor substrate 100, and an insulation film 120 is formed over a first hard mask layer 110. In an embodiment, the first hard mask layer 110 may include a nitride film. Preferably, the insulation film 120 may include an oxide film. In an embodiment, a reflection prevention film may also be formed over the first hard mask layer 110.

Figure 1B:
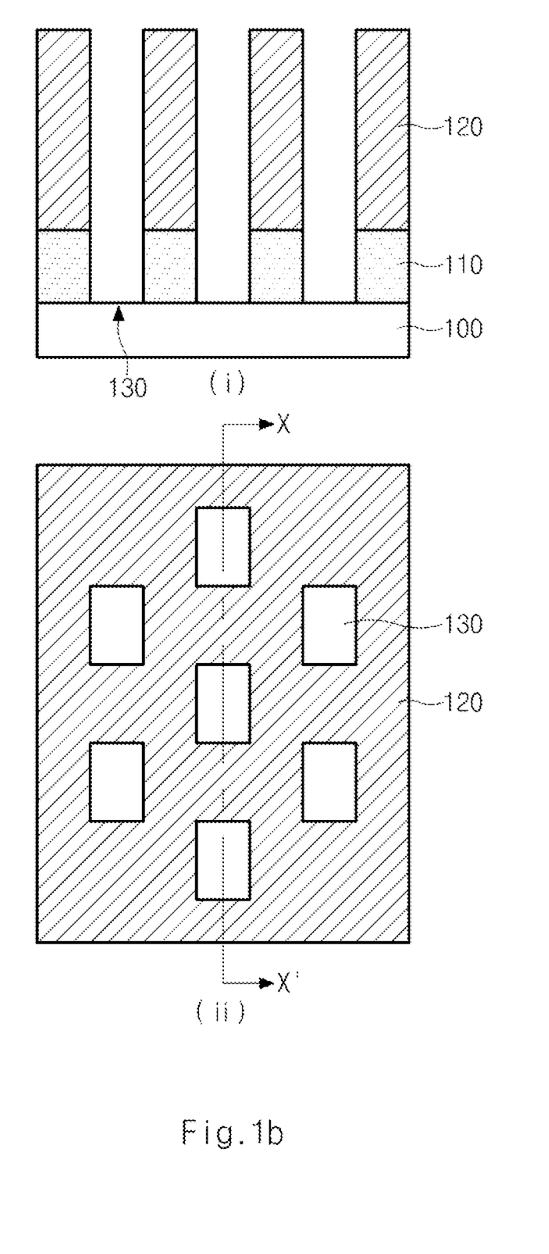

Referring to FIG. 1B, after a photoresist film is formed over the insulation film 120, a photoresist pattern (not shown) is formed by an exposure and development process using a mask for contact hole formation. The insulation film 120 and the first hard mask layer 110 are etched using the photoresist pattern as a mask, such that a contact hole 130 is formed. The contact holes 130 may be arranged in a checkerboard or zigzag arrangement as seen in FIG. 1B, thus forming an alternating pattern that will correspond to a pillar pattern for pillars formed in a subsequent process. In an embodiment, during the exposure process, a double patterning process may be performed using any one of EUV, ArF, immersion ArF, and KrF devices, such that a contact hole or pillar pattern may be formed.

Figure 1C:
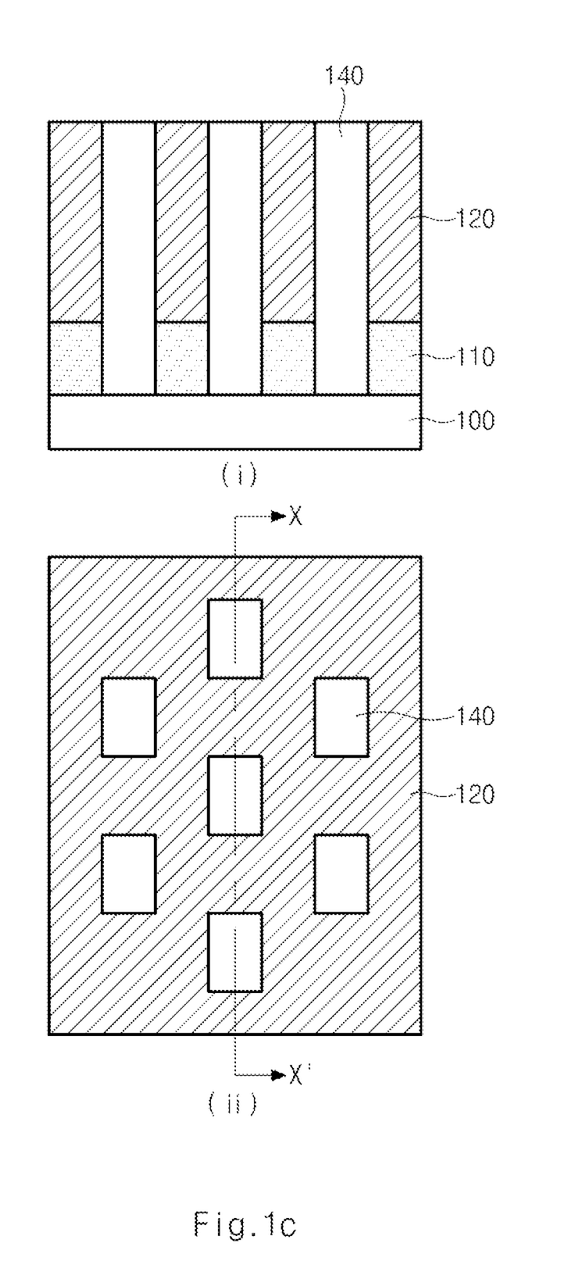

Referring to FIG. 1C, silicon (Si) is grown in the contact hole 130, and a pillar pattern 140 is formed. A planarization etching process, such as a chemical mechanical polishing (CMP), may be performed until the insulation film 120 is exposed. In an embodiment, the silicon (Si) growth process may be performed using two steps. In the first step, doped silicon is formed to create a channel region at the base of the pillar pattern 140. The doped silicon may be formed by depositing a layer of silicon, and implanting ions into the deposited silicon layer. In the second step, undoped silicon is formed over the doped silicon, limiting conductive portions of the pillar pattern 140 to the channel region disposed at lower portions of the pillars.

Figure 1D:
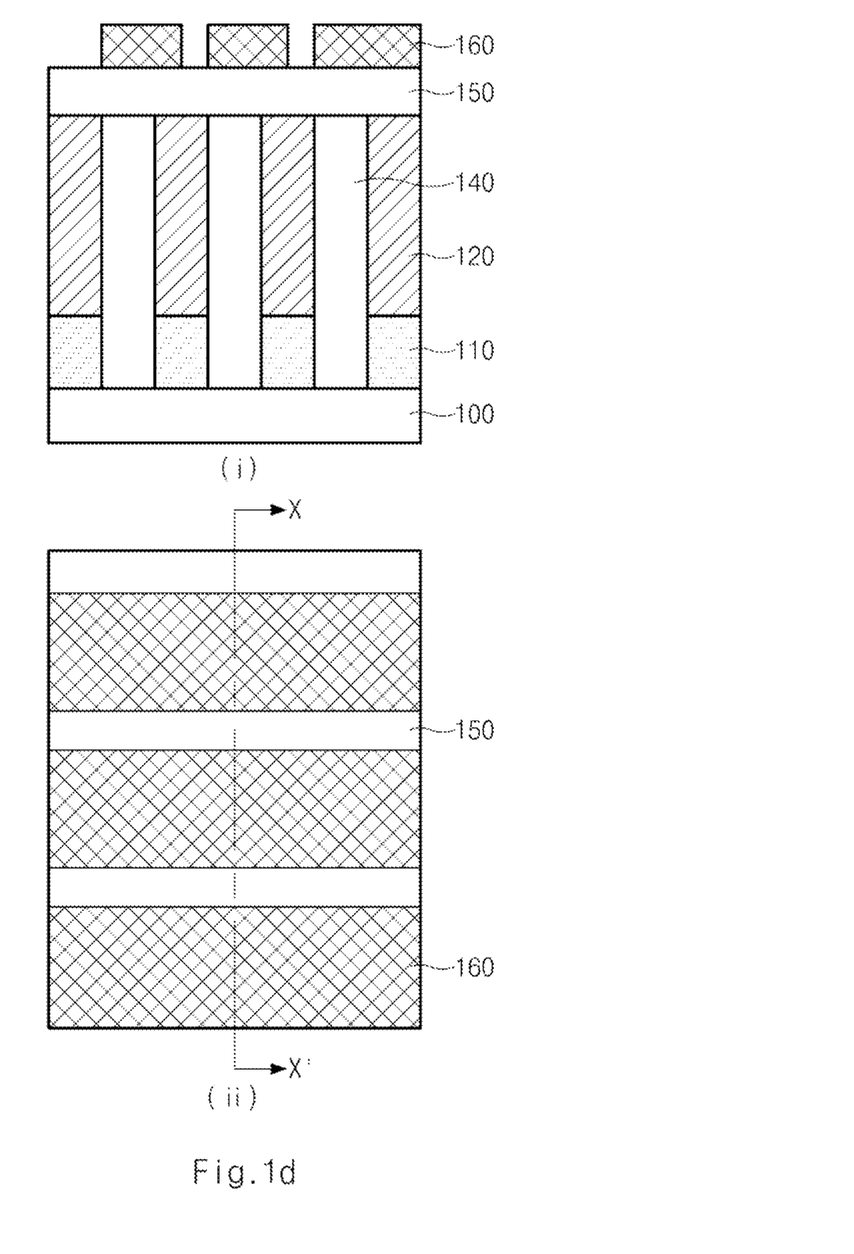

Referring to FIG. 1D, after a second hard mask layer 150 and a photoresist film are formed over the pillar pattern 140 and the insulation film 120, a photoresist pattern 160 is formed using an exposure and development process and a bit line mask.

Figure 1E:
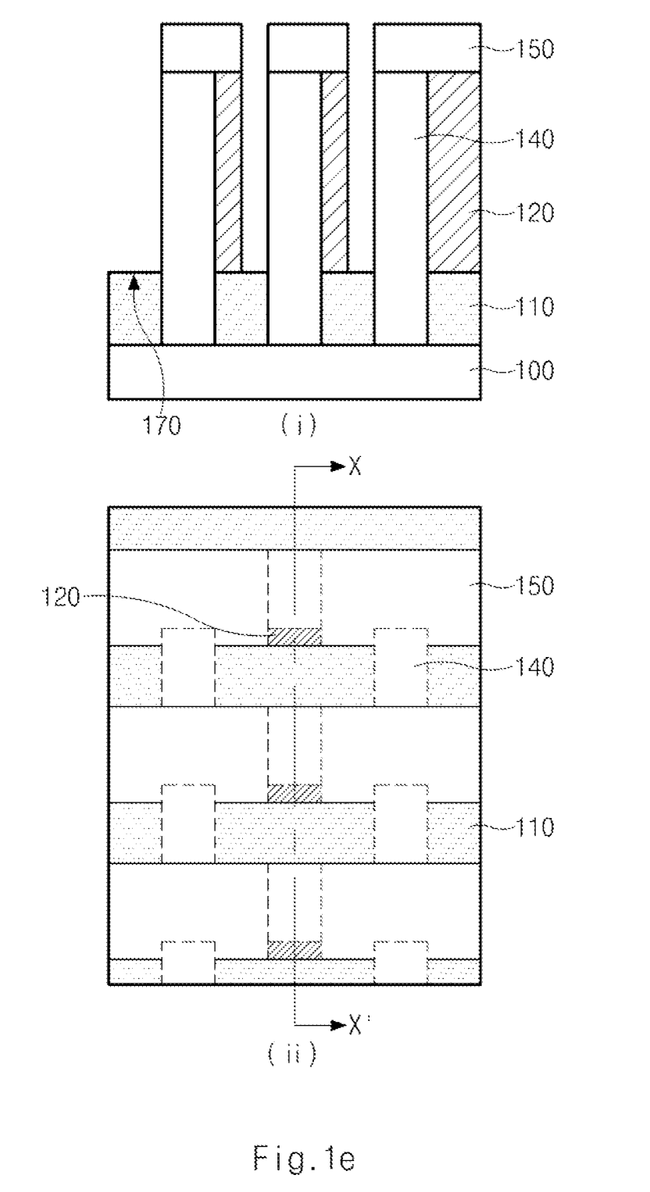

Referring to FIG. 1E, the second hard mask layer 150 and the insulation film 120 are etched using the photoresist pattern 160 as an etch mask until the first hard mask layer 110 is exposed, such that a first hole 170 is formed. In an embodiment, during the exposure process, a double patterning process may be performed using any one of EUV, ArF, immersion ArF, and KrF devices, such that a first hole 170, also referred to as a bit line region, may be formed. As shown in FIG. 1E (i), the resulting structures may include the pillar pattern 140, the insulating layer 120, and the hard mask layer provided over the pillar pattern 140 and the insulating layer 120, and are arranged in the checkerboard or zigzag pattern. As shown in FIG. 1E (ii), in an embodiment, not all of the pillar patterns 140 in the checkerboard arrangement may have the same configuration as the above-described structure. For example, in FIG. 1E (ii), viewing the pillar patterns in sequence from left to right, pillar patterns on the left and right side of the plan view may not be provided in the same structure as the pillar patterns provided in the center, along the line X-X'. However, in an embodiment, all of the pillar patterns in the checkerboard arrangement may be provided in the same or similar structure including the pillar pattern 140, the insulating layer 120, and the hard mask layer 150, as shown in FIG. 1E (i).

Figure 1F:
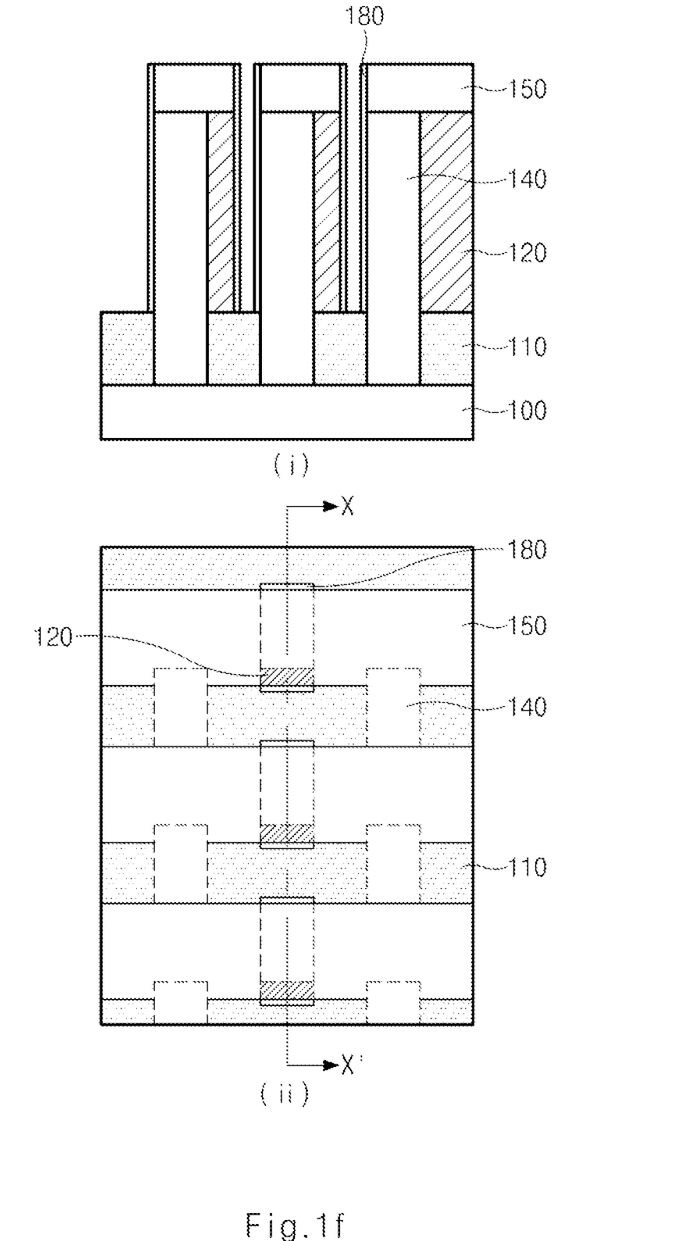

Referring to FIG. 1F, after a passivation layer 180 is formed over the entire surface of the resulting structure, including the first hole 170 and the second hard mask layer 150, the passivation layer 180 is etched back until the second hard mask layer 150 is exposed. In an embodiment, the passivation layer is etched until the second hard mask layer 150 is exposed and until the first hard mask layer 110 is exposed, while the passivation layer 180 remains over sidewalls of the first hole 170. Preferably, the passivation layer 180 may include an oxide film or a nitride film.

Figure 1G:
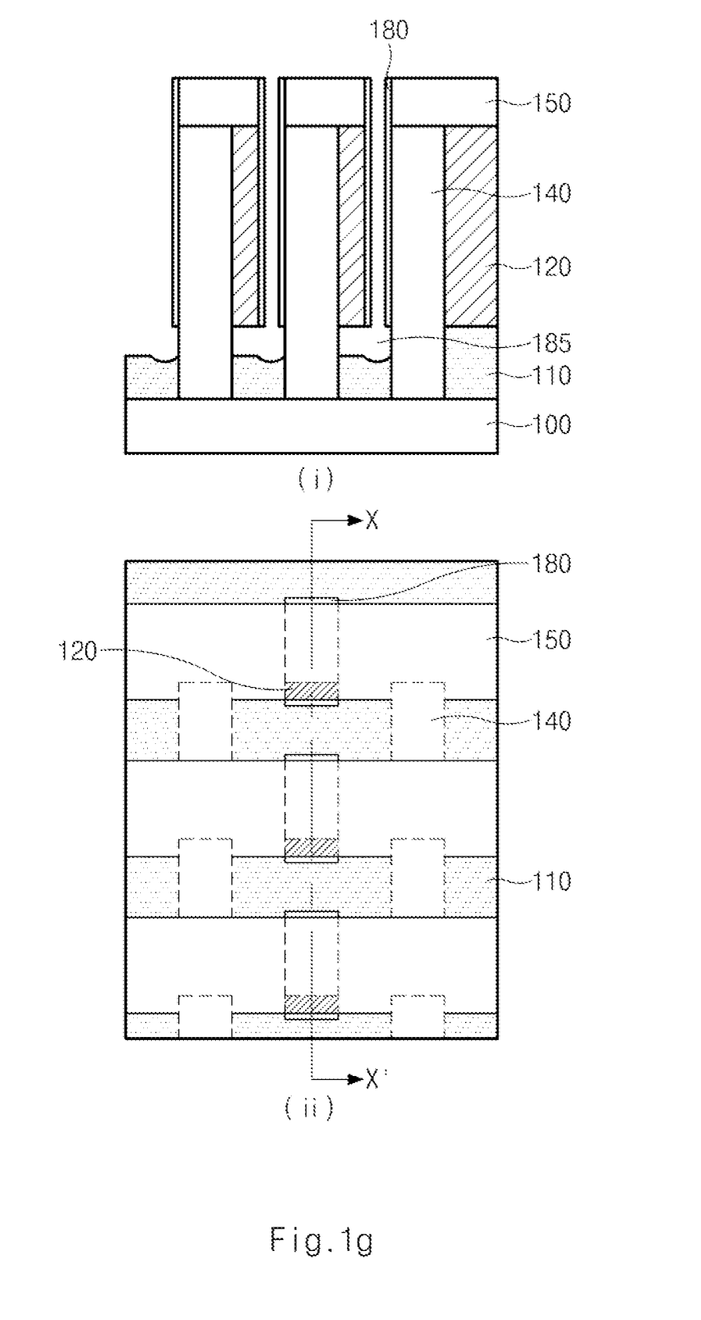

Referring to FIG. 1G, the first hard mask layer 110 exposed at the bottom of the first hole 170 is etched such that a second hole 185 is formed. Preferably, the first hard mask layer 110 may be etched using a wet etching process to form the second hole 185. As seen in FIG. 1F (i), the first hard mask layer 110 extends between two adjacent pillar patterns 140. In an embodiment, the wet etching process may be performed to expose portions the two adjacent pillar patterns 140. In this case, an exposed portion of a pillar pattern 140 is the location where a one sided contact (OSC) 200 will be formed. That is, in an embodiment, as shown in FIG. 1G (i), the wet etching process may be performed to remove portions of the hard mask layer 110 over sidewalls of both of adjacent pillar patterns 140. The second hole 185 may extend laterally below the insulating layer 120 and the passivation layer 180 so that a lower portion of the sidewalls of two adjacent pillars are exposed. In this case, the OSC 200 may be formed by an ion implantation process.

In an embodiment, as discussed above with respect to FIG. 1C, the pillar pattern 140 is formed in a two-step process, where the first step is forming doped silicon, and the second step is forming undoped silicon. In such an embodiment, it may not be necessary to perform ion implantation to form OSC 200.

During the wet etching process, the passivation layer 180 may prevent the pillar pattern 140 from being damaged. In addition, the passivation layer 180 may prevent the pillar pattern 140 from being damaged during an etchback process after a metal or doped polysilicon has been deposited as described below.

Figure 1H:
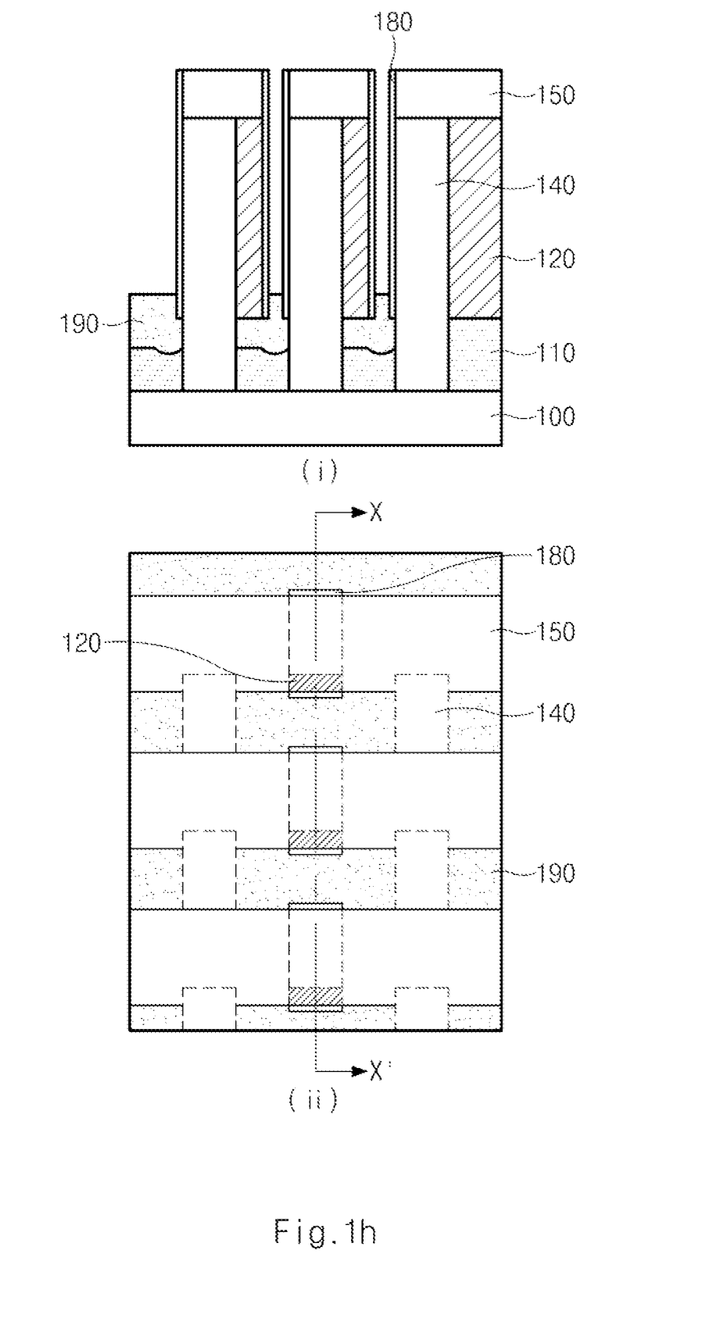

Referring to FIG. 1H, a metal or doped polysilicon is deposited in the second hole 185 and is then etched back to form a buried bit line 190. Preferably, the buried bit line may be formed as a line type.

Figure 1I:
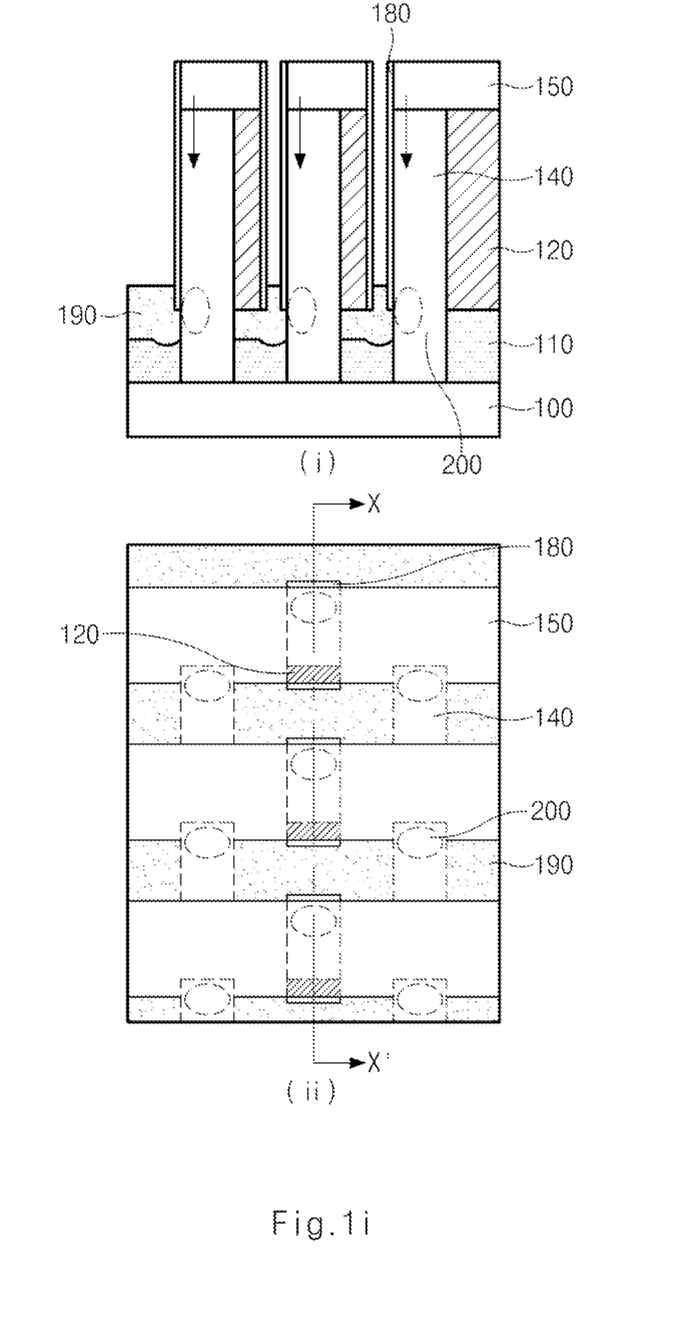

Referring to FIG. 1I, after ion implantation is performed in the pillar pattern 140, an OSC 200 is formed. In this case, it is possible to perform ion implantation by adjusting the point on the pillar pattern where ion implantation is performed, and it is also possible to perform counter ion implantation by adjusting the point where ion implantation is performed. Thus, in an embodiment, the OSC 200 may be formed by a vertical ion implantation process, in which the angle of implantation is substantially perpendicular with respect to the semiconductor substrate.

Embodiments according to the above processes have OSCs 200 disposed on alternating sides of a buried bit line 190. For example, referring to FIG. 1I (ii), from the perspective of the buried bit line 190, every other pillar 140 includes an OSC 200 disposed on an opposite side of the buried bit line 190. In other words, referring to FIG. 1I (ii), consider the buried bit line 190 in the middle of the figure. With respect to the orientation of the figure, moving from the left side of the buried bit line 190, the first pillar 140 is disposed on the buried bit line 190, so that the OSC 200 is disposed on the upper side of the pillar. The second pillar 140 is disposed on the hard mask layer 150 and includes an OSC 200 disposed on the upper side of the pillar. Subsequent pillars 140 along buried bit line 190 are similarly arranged so that the OSCs 200 of alternating pillars 140 are exposed to a given buried bit line 190. In various embodiments, the pillars 140 may be disposed flush with sidewalls of the bit line 190, or may partially overlap a portion of bit line, such that the bit line contacts three sides of the pillars 140.

Figure 2:
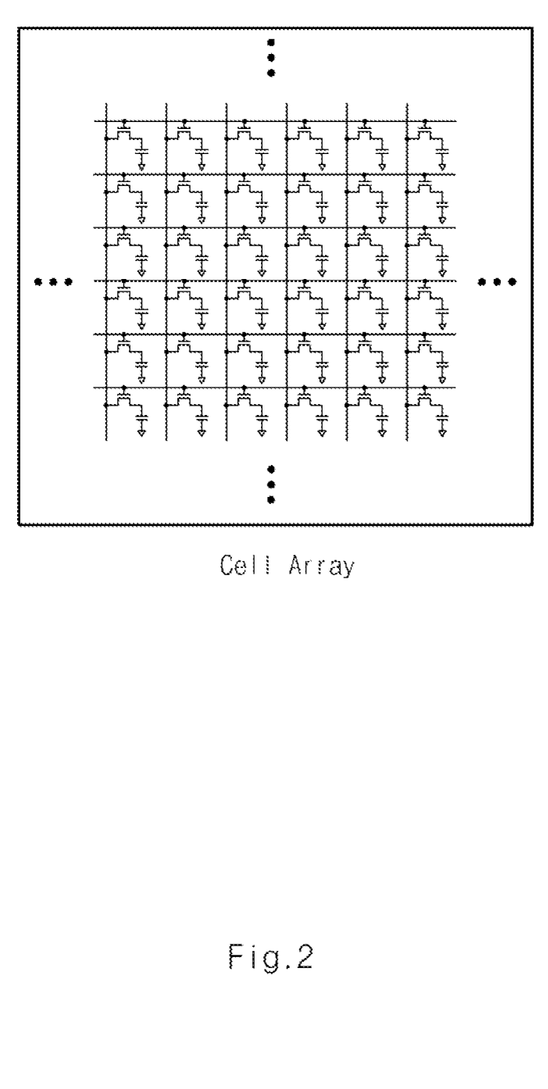
FIG. 2 is a block diagram illustrating a cell array according to an embodiment of the present invention.

FIG. 2 is a block diagram illustrating a cell array according to an embodiment of the present invention.

Referring to FIG. 2, the cell array includes a plurality of memory cells, and each memory cell includes one transistor and one capacitor. Such memory cells are located at intersections of bit lines BL1~BLn and word lines WL1~WLm. The memory cells may store or output data in response to a voltage applied to any bit line (BL1, . . . , BLn) or any word line (WL1, . . . , WLm) selected by a column decoder and a row decoder.

As can be seen from FIG. 2, a first direction (i.e., a bit-line direction) of the bit lines (BL1, . . . , BLn) of the cell array is the transverse direction, and a second direction (i.e., a word-line direction) of the word lines (WL1, . . . , WLm) is the longitudinal direction, such that the bit lines (BL1, . . . , BLn) cross the word lines (WL1, . . . , WLm). A first terminal (for example, a drain terminal) of a transistor is coupled to the bit lines (BL1, . . . , BLn), a second terminal (for example, a source terminal) thereof is coupled to a capacitor, and a third terminal thereof (for example, a gate terminal) is coupled to the word lines (WL1, . . . , WLm). A plurality of memory cells including the bit lines (BL1, . . . , BLn) and the word lines (WL1, . . . , WLm) may be located in a semiconductor cell array.

Figure 3:
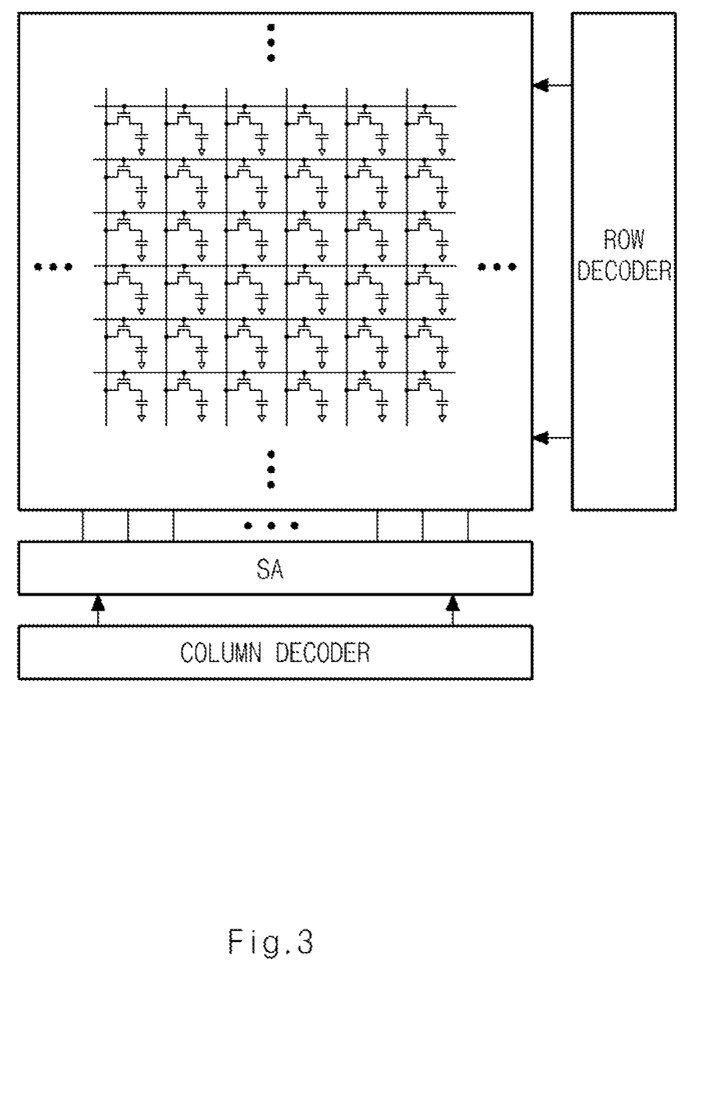
FIG. 3 is a block diagram illustrating a semiconductor device according to an embodiment of the present invention.

FIG. 3 is a block diagram illustrating a semiconductor device according to an embodiment of the present invention.

Referring to FIG. 3, the semiconductor device may include a cell array, a row decoder, a column decoder, and a sense amplifier (SA). The row decoder selects a word line corresponding to a memory cell in which a read or write operation is to be performed from among a plurality of word lines of the semiconductor cell array, and outputs a word-line selection signal to the semiconductor cell array. In addition, the column decoder selects a bit line corresponding to a memory cell in which a read or write operation is to be performed from among a plurality of bit lines of the semiconductor cell array, and outputs a bit-line selection signal to the semiconductor cell array. In addition, the sense-amplifier (SA) may sense data stored in a memory cell selected by the row decoder and column decoder.

The semiconductor device may be coupled to a microprocessor or a memory controller. The semiconductor device may receive control signals such as WE*, RAS* and CAS* from the microprocessor, receives data through an input/output (I/O) circuit, and stores the received data. The semiconductor device may be applied to a Dynamic Random Access Memory (DRAM), a P-Random Access Memory (P-RAM), an M-Random Access Memory (M-RAM), a NAND flash memory, a CMOS Image Sensor (CIS), and the like. Specifically, the semiconductor device may be applied to a desktop, a laptop, or a server, and may also be applicable to a graphics memory and a mobile memory. A NAND flash memory is applicable not only to a variety of portable storage media (for example, a memory stick, a multimedia card (MMC), a secure digital (SD) card, a compact flash (CF) card, an eXtreme Digital (XD) card, a universal serial bus (USB) flash drive, etc.), but also to a variety of digital applications (for example, MP3 players, PMPs, digital cameras, camcorders, memory cards, USB, game machines, navigation devices, laptops, desktop computers, mobile phones, and the like). A CMOS Image Sensor (CIS) is a charge coupled device (CCD) serving as an electronic film in digital devices, and is applicable to camera phones, Web cameras, small-sized medical imaging devices, etc.

Figure 4:
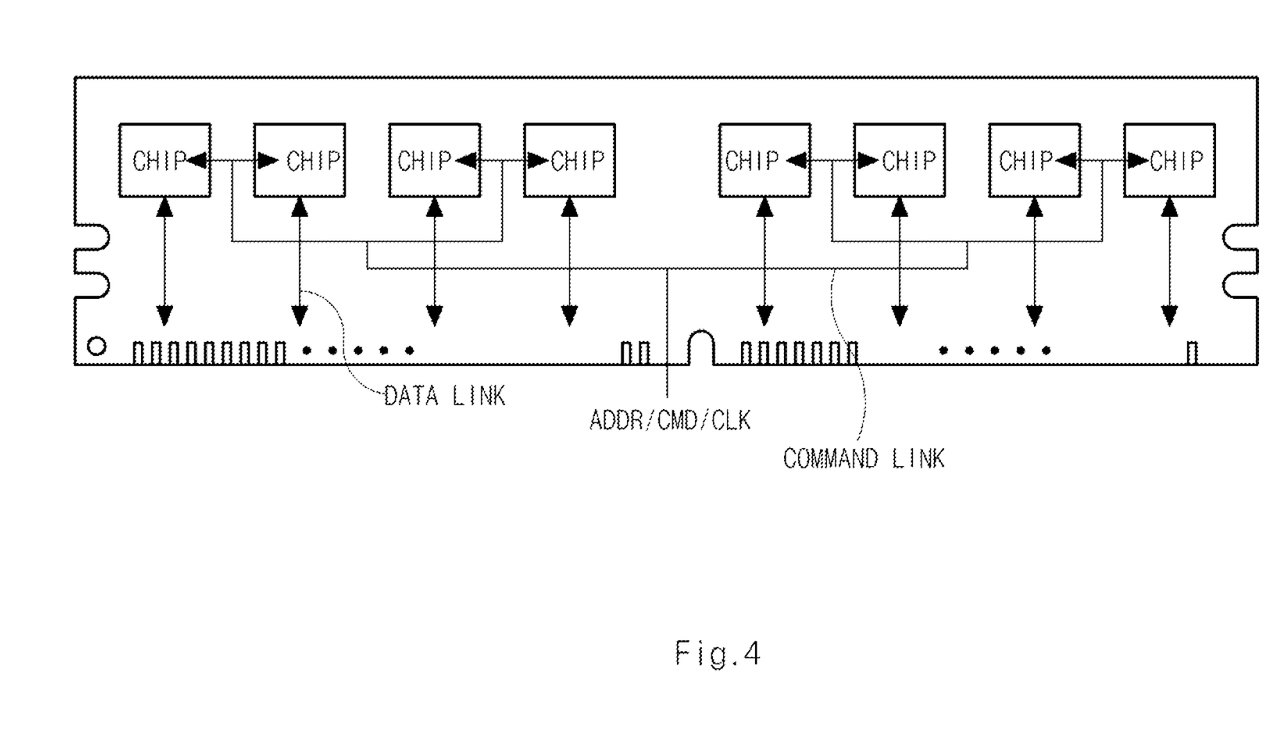
FIG. 4 is a block diagram illustrating a semiconductor module according to an embodiment of the present invention.

FIG. 4 is a block diagram illustrating a semiconductor module according to an embodiment the present invention.

Referring to FIG. 4, a semiconductor module includes a plurality of semiconductor devices mounted to a module substrate, a command link for enabling each semiconductor device to receive a control signal (address signal (ADDR)), a command signal (CMD), a clock signal (CLK) from an external controller (not shown), and a data link coupled to a semiconductor device to transmit data.

In an embodiment, the semiconductor device may correspond to the semiconductor device disclosed in FIG. 3. The command link and the data link may be formed to be identical or similar to those of general semiconductor modules.

Although eight semiconductor chips are mounted to the front surface of the module substrate as shown in FIG. 4, it should be noted that a plurality of semiconductor chips can also be mounted to the back surface of the module substrate. That is, the semiconductor chips can be mounted to one side or both sides of the module substrate, and the number of mounted semiconductor chips is not limited to those illustrated in in FIG. 4. In addition, a material or structure of the module substrate is not limited to those of FIG. 4; the module substrate may also be formed of other materials or structures.

Figure 5:
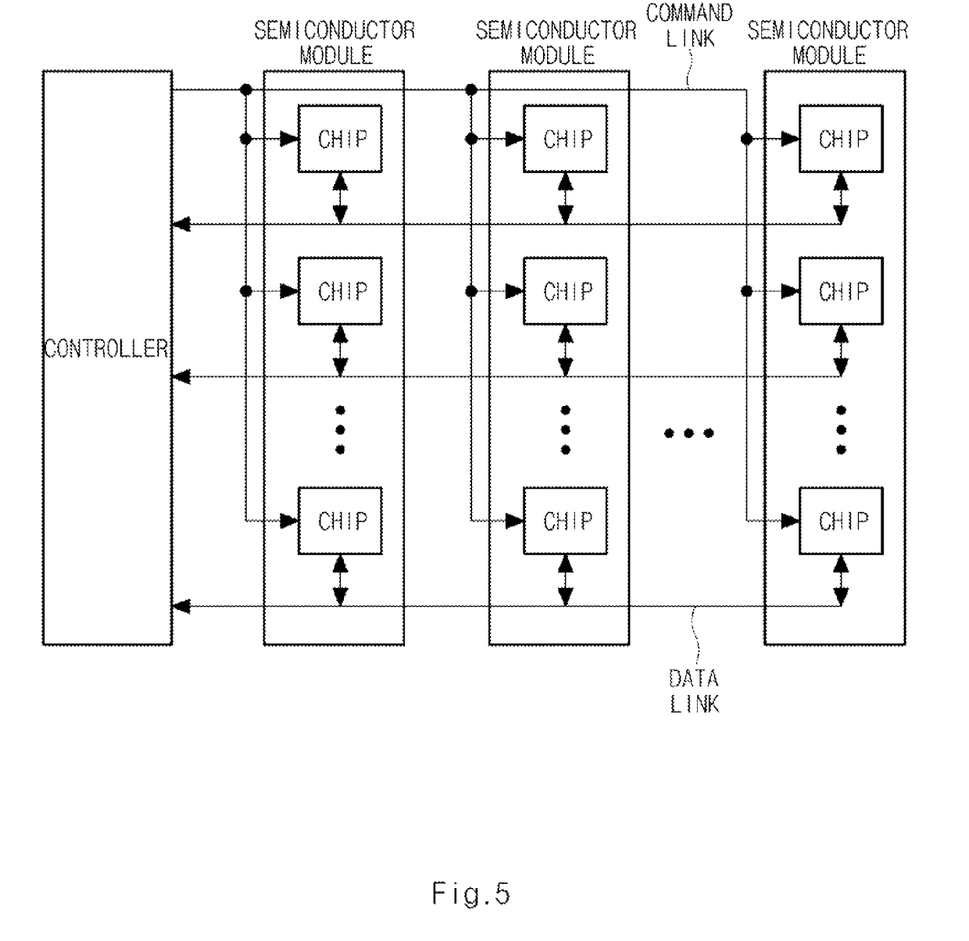
FIG. 5 is a block diagram illustrating a semiconductor system according to an embodiment of the present invention.

FIG. 5 is a block diagram illustrating a semiconductor system employing a semiconductor device according to an embodiment of the present invention.

Referring to FIG. 5, a semiconductor system includes at least one semiconductor module including a plurality of semiconductor chips, and a controller for providing a bidirectional interface between each semiconductor module and an external system (not shown) to control the operations of the semiconductor module. The controller may be identical or similar in function to a controller for controlling a plurality of semiconductor modules for use in a general data processing system, and as such, a detailed description thereof will be omitted herein for convenience of description. The semiconductor module may be, for example, a semiconductor module shown in FIG. 4.

Figure 6:
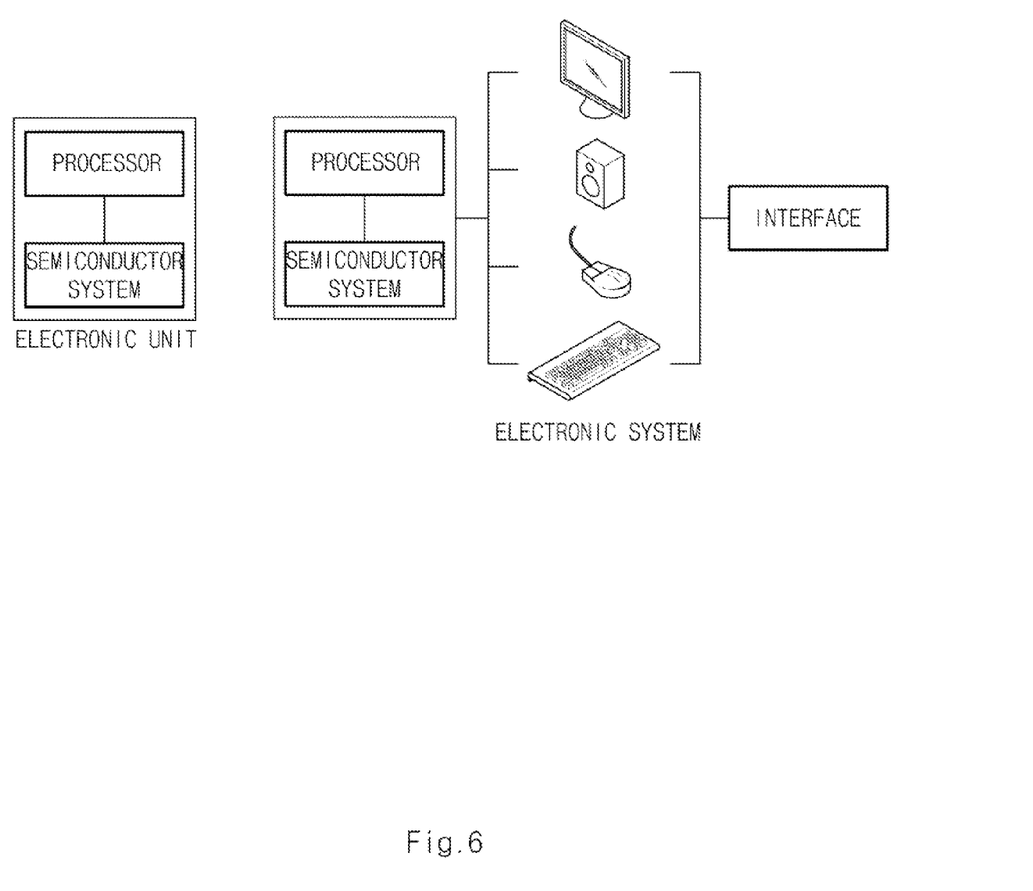
FIG. 6 is a block diagram illustrating an electronic unit and an electronic system according to embodiments of the present invention.

FIG. 6 is a block diagram illustrating an electronic unit and an electronic system employing a semiconductor device according to an embodiment of the present invention.

Referring to the block diagram on the left of FIG. 6, the electronic unit according to the present invention includes semiconductor system and a processor electrically coupled to the electronic unit. The semiconductor system of FIG. 6 may be the system shown in FIG. 5. In this case, the processor may include a Central Processing Unit (CPU), a Micro Processor Unit (MPU), a Micro Controller Unit (MCU), a Graphics Processing Unit (GPU), and a Digital Signal Processor (DSP).

The CPU or MPU may be configured as a combination of an Arithmetic Logic Unit (ALU), serving as an arithmetic and logical operation unit, and a Control Unit (CU) for controlling each unit by reading and interpreting a command. Preferably, if the processor is a CPU or MPU, the electronic unit may include a computer or a mobile device. In addition, the GPU is used to calculate numbers having decimal points, and corresponds to a process for generating graphical data in real-time. Preferably, if the processor is a GPU, the electronic unit may include a graphic device. In addition, the DSP is adapted for converting an analog signal (e.g., voice signal) into a digital signal at high speed, using the calculated result, re-converting the digital signal into an analog signal, and using the re-converted result. The DSP mainly calculates a digital value. If the processor is a DSP, the electronic unit may preferably include a sound and imaging device.

The processor includes an Accelerate Calculation Unit (ACU), and is configured in the form of a CPU integrated into the GPU, such that it serves as a graphics card.

Referring to the block diagram on the right of FIG. 6, the electronic system may include one or more interfaces electrically coupled to the electronic unit. The interface may include a monitor, a keyboard, a printer, a pointing device (mouse), a USB, a switch, a card reader, a keypad, a dispenser, a phone, a display, or a speaker. However, it should be noted that the scope of the interface is not limited thereto.

As is apparent from the above description, a semiconductor device and a method for forming the same according to an embodiment of the present invention have the following advantages. In a semiconductor device and a method for manufacturing the same according to embodiments of the present invention, pillars are alternately arranged on opposing sides of a bit line, and a one side contact (OSC) may be formed without using a tilted ion implantation process or a mask, resulting in formation of a vertical gate.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a pillar pattern including a plurality of pillars that is arranged in a zigzag pattern and includes a first pillar, a second pillar, and a third pillar;
   a stacked structure including an insulation film and a hard mask layer, the stacked structure being disposed between the first pillar and the second pillar;
   a first hole disposed between the insulation film and the second pillar;
   a passivation layer disposed against a sidewall of the first hole;
   a second hole disposed over the hard mask layer and below the first hole and the insulation film, the second hole being formed by partially etching the hard mask layer disposed below a lower part of the first hole;
   a bit line disposed in the second hole, the bit line comprising first and second opposing longitudinal sides;
   a first contact disposed at a lower part of the first pillar;
   a second contact disposed at a lower part of the second pillar; and
   a third contact disposed at a lower part of the third pillar,
   wherein the third pillar and the first pillar are arranged diagonally, and
   wherein the first contact and the second contact are disposed on the first side of the bit line, and the third contact is disposed on the second side of the bit line.

2. The semiconductor device according to claim 1, wherein the pillar pattern includes silicon (Si), and a channel region is disposed at the lower part of the pillars in the pillar pattern.

3. The semiconductor device according to claim 1, wherein the passivation layer includes an oxide film or a nitride film.

4. The semiconductor device according to claim 1, wherein the bit line is a line type.

5. The semiconductor device according to claim 1, wherein the pillars in the pillar pattern overlap portions of the bit line.

6. The semiconductor device according to claim 1, wherein the pillars in the pillar pattern are flush with sidewalls of the bit line.

7. The semiconductor device according to claim 1, wherein the hard mask layer and the insulation film have different etch rates from each other.

8. The semiconductor device according to claim 1, wherein the hard mask layer includes a nitride film and the insulation film includes an oxide film.

9. The semiconductor device according to claim 1, wherein a width of the second hole is greater than a width of the first hole.

10. A semiconductor device comprising:
    a plurality of pillars arranged in a zigzag pattern and including a first pillar, a second pillar, and a third pillar;
    a stacked structure including an insulation film disposed over a hard mask layer, the stacked structure being disposed between the first pillar and the second pillar;
    a first hole disposed between the insulation film and the second pillar;
    a passivation layer disposed against a sidewall of the first hole;

a second hole disposed over the hard mask layer and below a lower part of the first hole and the insulation film, a width of the second hole being greater than a width of the first hole;
a bit line disposed in the second hole, the bit line comprising first and second opposing longitudinal sides; and
a first contact disposed at a lower part of the first pillar;
a second contact disposed at a lower part of the second pillar; and
a third contact disposed at a lower part of the third pillar,
wherein the third pillar and the first pillar are arranged diagonally, and
wherein the first contact and the second contact are disposed on the first side of the bit line, and the third contact is disposed on the second side of the bit line.

* * * * *